(12) United States Patent
Yan

(10) Patent No.: US 9,799,259 B2
(45) Date of Patent: Oct. 24, 2017

(54) ARRAY SUBSTRATE, DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Yan Yan, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 259 days.

(21) Appl. No.: 14/431,488

(22) PCT Filed: Jun. 30, 2014

(86) PCT No.: PCT/CN2014/081246
§ 371 (c)(1),
(2) Date: Mar. 26, 2015

(87) PCT Pub. No.: WO2015/100989
PCT Pub. Date: Jul. 9, 2015

(65) Prior Publication Data
US 2016/0027372 A1 Jan. 28, 2016

(30) Foreign Application Priority Data
Dec. 30, 2013 (CN) .......................... 2013 1 0745801

(51) Int. Cl.
*G09G 3/20* (2006.01)
*H01L 27/02* (2006.01)
(Continued)

(52) U.S. Cl.
CPC ..... *G09G 3/2092* (2013.01); *G02F 1/136204* (2013.01); *G09G 3/006* (2013.01);
(Continued)

(58) Field of Classification Search
CPC ............ G02F 1/136204; G09G 3/2092; G09G 2330/025; H01L 27/0296
(Continued)

(56) References Cited

U.S. PATENT DOCUMENTS 6,111,620 A 8/2000 Nishiki et al.
6,340,963 B1 1/2002 Anno et al.
(Continued)

FOREIGN PATENT DOCUMENTS

CN 1396656 A 2/2003
CN 1955825 A 5/2007
(Continued)

OTHER PUBLICATIONS

First Chinese Office Action Appln. No. 201310745801.6; Dated Sep. 17, 2015.
(Continued)

*Primary Examiner* — Michael Pervan
(74) *Attorney, Agent, or Firm* — Ladas & Parry LLP

(57) ABSTRACT

An array substrate, a display panel and a display device are provided. The array substrate includes a plurality of data lines, a plurality of gate lines, a first lead and/or a second lead. Where the array substrate includes the first lead, at least one data line is connected with the first lead on the array substrate through at least one first electrostatic discharging device, and each first electrostatic discharging device is connected with only one data line; where the array substrate includes the second lead, at least one gate line is connected with the second lead on the array substrate through at least one second electrostatic discharging device, and each second electrostatic discharging device is connected with only one gate line. The array substrate can avoid breakdown and
(Continued)

damage of circuits due to a large amount of accumulated charges in circuits while the display panel is squeezed or rubbed.

14 Claims, 4 Drawing Sheets

(51) Int. Cl.
  *G02F 1/1362*  (2006.01)
  *G09G 3/00*  (2006.01)
  *G02F 1/1333*  (2006.01)
  *G09G 3/36*  (2006.01)

(52) U.S. Cl.
  CPC ........... *G09G 3/20* (2013.01); *H01L 27/0296* (2013.01); *G02F 2001/133388* (2013.01); *G09G 3/3611* (2013.01); *G09G 2330/025* (2013.01); *G09G 2330/04* (2013.01); *G09G 2330/06* (2013.01); *G09G 2330/08* (2013.01)

(58) Field of Classification Search
  USPC .................................................. 345/211–213
  See application file for complete search history.

(56) References Cited

U.S. PATENT DOCUMENTS

| | | |
|---|---|---|
| 2003/0020845 A1 | 1/2003 | Lee et al. |
| 2008/0079859 A1 | 4/2008 | Ota |
| 2010/0165226 A1 | 7/2010 | Lee et al. |

FOREIGN PATENT DOCUMENTS

| | | |
|---|---|---|
| CN | 101285974 A | 10/2008 |
| CN | 103698953 A | 4/2014 |
| TW | 536648 B | 6/2003 |

OTHER PUBLICATIONS

International Search Report Appln. No. PCT/CN2014/081246; Dated Sep. 30, 2014.

Written Opinion of the International Searching Authority Appln. No. PCT/CN2014/081246; Dated Sep. 30, 2014.

Second Chinese Office Action Appln. No. 201310746801.6; Dated Jan. 26, 2016.

ARRAY SUBSTRATE, DISPLAY PANEL AND DISPLAY DEVICE

TECHNICAL FIELD

Embodiments of the present invention relate to an array substrate, a display panel and a display device.

BACKGROUND

A display device may adopt different types of display panels, such as an organic light emitting diode (OLED) panel or a thin film transistor liquid crystal display (TFT-LCD) panel. A constituent part of the display panel, i.e., the array substrate will be explained below with a TFT-LCD as an example.

A TFT-LCD is generally formed by cell-assembling an array substrate and a color filter substrate. In the array substrate, gate lines and data lines intersect each other to define pixel areas each configured with a pixel electrode and a thin film transistor. The color filter substrate is configured with a black matrix and color filter layers corresponding to pixel areas. The array substrate is configured with common electrode lines. Liquid crystal is filled between the array substrate and the color filter substrate. Driving signals and data signals (voltages of pixel electrodes) are applied to form an electric field that controls rotation of liquid crystal so as to control magnitude of light, which is combined with the color filtering function of the color filter substrate to enable the display panel to display images intended to be expressed.

SUMMARY

Embodiments of the present invention provide an array substrate, a display panel and a display device to avoid circuit breakdown and damage caused by significant accumulation of charges in the circuit while being squeezed or rubbed.

An array substrate provided in an embodiment of the present invention includes a plurality of data lines, a plurality of gate lines, a first lead and/or a second lead. Where the array substrate comprises the first lead, at least one data line is connected with the first lead through at least one first electrostatic discharging device, each first electrostatic discharging device is connected with only one data line, the first electrostatic discharging device is configured to be turned on when a voltage of a signal on the data line connected with it is greater than a first threshold, and turned off when the voltage of the signal on the data line connected with it is not greater than a second threshold, and a voltage of a signal on the first lead is not greater than the second threshold; where the array substrate comprises the second lead, at least one gate line is connected with the second lead through at least one second electrostatic discharging device, each of the second electrostatic discharging device is connected with only one gate line, the second electrostatic discharging device is configured to be turned on when a voltage of a signal on the gate line connected with it is greater than a third threshold, and turned off when the voltage of the signal on the gate line connected with it is not greater than a fourth threshold, and a voltage of a signal on the second lead is not greater than the fourth threshold.

An embodiment of the present invention further provides a display panel including the array substrate provided in the above-mentioned embodiments.

An embodiment of the present invention further provides a display device including the display panel provided in the embodiment of the present invention.

BRIEF DESCRIPTION OF DRAWINGS

In order to explain the technical solution of embodiments of the present invention more clearly, accompanying drawings of the embodiments will be introduced briefly below. Obviously, the accompanying drawings in the following description only relate to some embodiments of the present invention rather than limiting the present invention.

DETAIL DESCRIPTION

Figure 1:
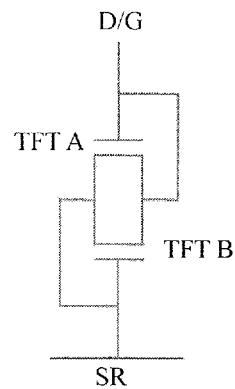
FIG. 1 is a structural schematic view of an electrostatic discharge device.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The inventor of the present application has noted that during the manufacturing and transportation process of a display panel, due to a squeezing or rubbing action, a significant amount of charges tend to accumulate in circuits of the display panel and these static charges are likely to breakdown circuits in the display panel, thereby causing damage to circuits in the display panel.

At least one embodiment of the present invention provides an array substrate in which at least one data line is connected to a first lead on the array substrate via at least one first electrostatic discharging device and each electrostatic discharging device in connected with only one data line. This enables charges to accumulate in the circuit connected with the data line connected with the first electrostatic discharging device in the display panel including the array substrate, and the charges accumulated in circuits connected with the data line can be discharged to the first lead via the first electrostatic discharging device when the first electrostatic discharging device connected with the data line is turned on, thereby avoiding breaking down the circuit due to the accumulated charges. And, after charges accumulated in the circuit connected with the data line are discharged, when the first electrostatic discharging device connected with the data line is turned off, the data line can transmit signals to the pixel connected therewith, which avoid interference on the pixel connected with the data line by signals on the first lead, hence ensuring that the display panel including the array substrate can work normally.

In this array substrate, at least one gate line is connected to a second lead on the array substrate via at least one second electrostatic discharging device and each second electrostatic discharging device is connected to only one gate line. This enables charges to accumulate in the circuit connected with the gate line connected with the second electrostatic discharging device in the display panel including the array substrate, and charges accumulated in circuits connected with the gate line can be discharged to the second lead via the second electrostatic discharging device when the second electrostatic discharging device connected with the gate line is turned on, thereby avoiding breaking down the circuit due to the accumulated charges. And, after charges accumulated in the circuit connected with the gate line are discharged, when the second electrostatic discharging device connected with the gate line is turned off, the gate line can transmit signals to the pixel connected therewith, which avoid interference on the pixel connected with the gate line by signals on the second lead, hence ensuring that the display panel including the array substrate can work normally.

An array substrate, a display panel and a display device provided in at least one embodiment of the present invention will be explained below with respect to accompanying drawings of the specification.

At least one embodiment of the present invention provides an array substrate including a plurality of data lines, a plurality of gate lines, a first lead and/or a second lead. In at least one embodiment of the present invention, at least one data line is connected with the first lead on the array substrate via at least one first electrostatic discharging device, and each first electrostatic discharging device is connected with only one data line. In at least one embodiment of the present invention, at least one gate line is connected to a second lead on the array substrate via at least one second electrostatic discharging device and each second electrostatic discharging device is connected to only one gate line. In at least one embodiment of the present invention, the first electrostatic discharging device is configured to he turned on when a voltage of a signal on the data line connected therewith is greater than a first threshold, and turned off when a voltage of a signal on the data line connected therewith is not greater than a second threshold, and a voltage of the signal on the first lead is not greater than the second threshold. In at least one embodiment of the present invention, the second electrostatic discharging device is configured to be turned on when a voltage of a signal on the gate line connected therewith is greater than a third threshold, and turned off when a voltage of a signal on the gate line connected therewith is not greater than a fourth threshold, and a voltage of a signal on the second lead is not greater than the fourth threshold.

In one example, the first threshold is related to the structure of the first electrostatic discharging device, and is about hundreds of volts to thousands of volts when two thin film transistors are included for the first electrostatic discharging device.

In one example, the second threshold is determined by characteristics of the thin film transistor(s) in the first electrostatic discharging device and is about zero volt.

For example, an electrostatic discharging device shown in FIG. 1 includes two thin film transistors TFT A and TFT B, and have one end connected with the data line D or gate line G and the other end connected with a short-circuit ring SR. The operation principle of the electrostatic discharging device is as follows: if static electricity accumulated on the data line D or the gate line G needs to be discharged, it can be discharged onto SR by turning on TFT A. On the contrary, static electricity on the short-circuit ring SR may also flow onto the data line D or the gate line G by turning TFT B to allow charges dispersed as much as possible. As can be known from this, when two thin film transistors are used for the first electrostatic discharging device, if a voltage of a signal on the data line connected with the first electrostatic discharging device is greater than the first threshold, the first electrostatic discharging device is turned on with a vary large on-current such that static charges accumulated on the data line connected therewith will be discharged rapidly, making the voltage on the data line and the voltage on the first lead equal, that is, not greater than the second threshold, and then the first electrostatic discharging device is turned off. When the voltage on the data line connected with the first electrostatic discharging device is tens of volts, the first electrostatic discharging device can also he turned on but with a very small on-current having negligible influence. Therefore, when a display panel including the array substrate works normally (for example, about 10V on the data line and about 20 V on the gate line, and about 5V on the common electrode), the first electrostatic discharging device will not influence the normal operation of the display panel.

In one example, the third threshold is related to the structure of the second electrostatic discharging device, and is about hundreds of volts to thousands of volts when two thin film transistors are included for the first electrostatic discharging device.

In one example, the fourth threshold is determined by characteristics of thin film transistors in the second electrostatic discharging device and is about zero volt.

When two thin film transistors are used as the second electrostatic discharging device, if a voltage of a signal on the data line connected with the second electrostatic discharging device is greater than the first threshold, the second electrostatic discharging device is turned on with a vary large on-current such that static charges accumulated on the gate line connected therewith will be discharged rapidly, making the voltage on the gate line and the voltage on the second lead equal, that is, not greater than the fourth threshold, and then the second electrostatic discharging device is turned off. When the voltage on the gate line connected with the second electrostatic discharging device is tens of volts, the second electrostatic discharging device can also be turned on, but with a very small on-current having negligible influence. Therefore, when a display panel including the array substrate works normally (for example, about 10V on the data line and about 20 V on the gate line, and about 5V on the common electrode), the second electrostatic discharging device will not influence the normal operation of the display panel.

Figure 2A:
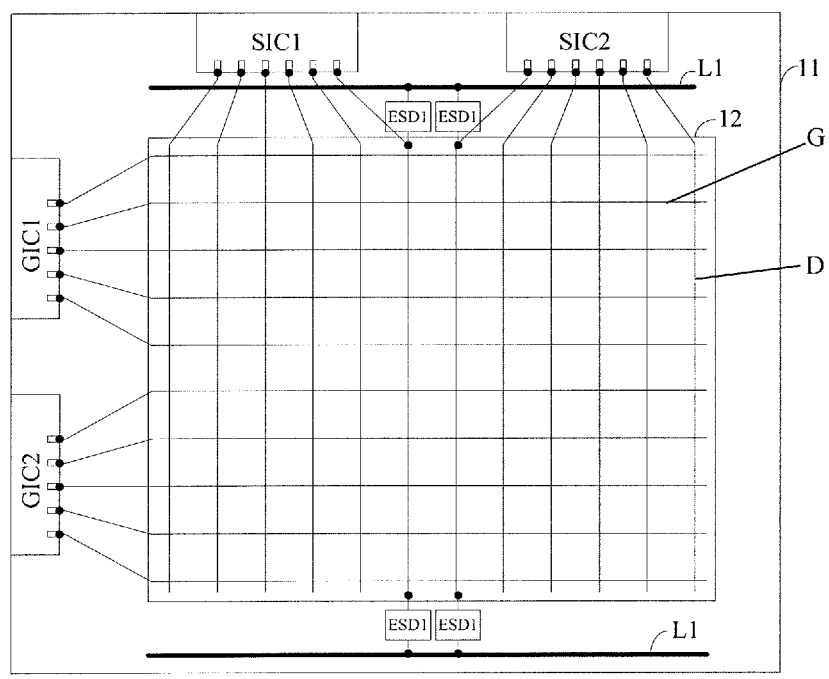
FIG. 2a is a structural schematic view of an array substrate I provided in an embodiment of the present invention.

FIG. 2a shows an array substrate 11 including a plurality of data lines D (longitudinal leads in the display areas 12) and a plurality of gate lines G (transversal leads in display areas 12). In the case shown in FIG. 2a, two data lines are connected with the first lead L1 on the array substrate 11 through respective first electrostatic discharging devices ESD1 respectively, with each first electrostatic discharging device ESD1 connected with only one data line and each of these two data lines connected with the first lead L1 on the array substrate 11 through two first electrostatic discharging devices ESD1 disposed on its two ends. In different examples, the first leads L1 may be located in the display area 12, and may also be located outside the display area 12, for example, the first lead L1 is located outside the display area 12. In one example, as shown in FIG. 2a, the array substrate further includes source driving integrated circuits SIC1 and SIC2 connected with data lines and gate driving integrated circuits GIC1 and GIC2 connected with gate lines. The source driving integrated circuits SIC1 and SIC2 and the gate driving integrated circuits GIC1 and GIC2 may be located on the array substrate 1, and may also be located on a flexible circuit board connected with the array substrate. In embodiments of the present invention, description will be given with respect to source driving integrated circuits SIC1 and SIC2 and gate driving integrated circuits GIC1 and GIC2 located on array substrate as an example. One or more first leads L1 may be disposed on the array substrate 11.

When static charges accumulated in an integrated circuit connected with a data line of the first electrostatic discharging device result in a voltage greater than a first threshold on the data line, the first electrostatic discharging device connected with the data line is turned on, enabling static charges accumulated in the integrated circuit connected with the data line to be released onto the first lead L1 through the first electrostatic discharging device connected with the data line, preventing the accumulated static charges from breaking down the integrated circuit connected with the data line. While after static charges are released, when the voltage on the data line is not greater than the second threshold, the first electrostatic discharging device connected with the data line is turned off, making the signal on the data line not interfered by the signal on the first lead L1, thereby the data line can transmit signals output by the source driving integrated circuits to the pixels (not shown in FIG. 2a). It is noted that only an integrated circuit is described as an example in the present embodiment and the following embodiments, however, static charges in an array substrate that may be released by the embodiment of the present invention are not limited thereto. For example, static charges generated in array substrate circuits may also be released by the embodiment of the present invention.

Figure 2B:
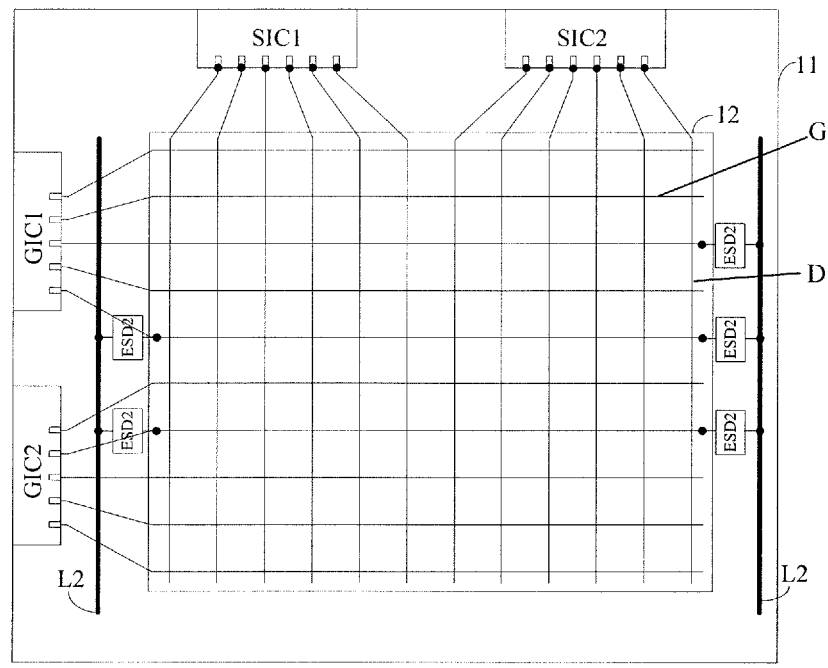
FIG. 2b is a structural schematic view of an array substrate II provided in an embodiment of the present invention.

The array substrate 11 shown in FIG. 2b includes a plurality of data lines D (longitudinal leads in the display area 12) and a plurality of gate lines G (transversal leads in the display area 12). In the case shown in FIG. 2b, three gate lines are connected with second leads L2 on the array substrate 11 through respective second electrostatic discharging devices ESD2 with each second electrostatic discharging device ESD2 connected with only one gate line. One of these three gate lines is connected with the second lead L2 on the array substrate 11 through one second electrostatic discharging device ESD2. The other two of these three gate lines are connected with the second lead L2 on the array substrate 11 through two second electrostatic discharging devices disposed on both ends of them. In different examples, the second leads L2 may be located in the display area 12, and may also be located outside the display area 12, for example, the second lead Ls is located outside the display area 12. In one example, as shown in FIG. 2b, the array substrate further includes source driving integrated circuits SIC 1 and SIC2 connected with data lines and gate driving integrated circuits GIC1 and GIC2 connected with gate lines. The source driving integrated circuits SIC1 and SIC2 and the gate driving integrated circuits GIC1 and GIC2 may be located on the array substrate 1, and may also be located on a flexible circuit board connected with the array substrate. One or more second leads L2 may be disposed on the array substrate 11.

When static charges accumulated in an integrated circuit connected with a gate line of the second electrostatic discharging device result in a voltage greater than a third threshold on the gate line, the second electrostatic discharging device connected with the gate line is turned on, enabling static charges accumulated in the integrated circuit connected with the gate line to be released onto the second lead L2 through the second electrostatic discharging device connected with the gate line, preventing the accumulated static charges from breaking down the integrated circuit connected with the gate line. While after static charges are released, when the voltage on the gate line is not greater than the fourth threshold, the second electrostatic discharging device connected with the gate line is turned off, preventing the signal on the gate line from being interfered by the signal on the second lead L2. The gate line can transmit signals output by the gate driving integrated circuit to pixels (not shown in FIG. 2b).

In one example, each data line on the array substrate is connected with the first lead on the array substrate through at least one first electrostatic discharging device.

In one example, each gate line on the array substrate is connected with the second lead on the array substrate through at least one second electrostatic discharging device.

Figure 3:
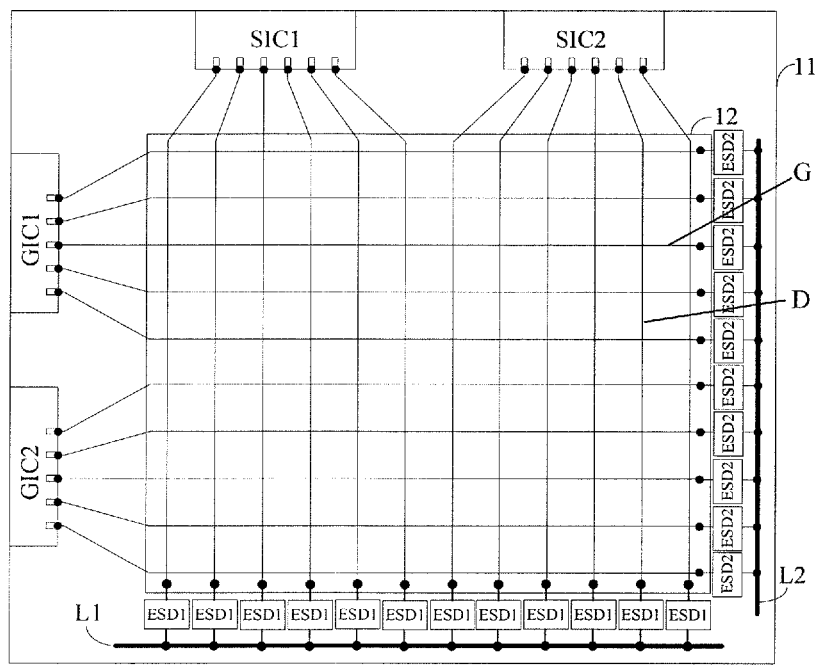
FIG. 3 is a structural schematic view of an array substrate III provided in an embodiment of the present invention.

As shown in FIG. 3, each data line on the array substrate 11 is connected with the first lead L1 on the array substrate 11 through one first electrostatic discharging device ESD1; and each gate line on the array substrate 11 is connected with a second lead L2 on the array substrate 11 through one second electrostatic discharging device ESD2.

The array substrate provided in at least one embodiment of the present invention may further include at least one first short-circuit ring and a third electrostatic discharging device located for example on the array substrate, and the first short-circuit ring connect the first electrostatic discharging device and the third electrostatic discharging device in series. In one example, each first short-circuit ring is connected with at least one first electrostatic discharging device, and each first short-circuit ring is connected with a first lead for example on the array substrate through a third electrostatic discharging device. The third electrostatic discharging device is configured to be turned on when a voltage of a signal on the first short-circuit ring connected with it is not greater than a fifth threshold, and turned off when a voltage of a signal on the first short-circuit ring connected with it is not greater than a sixth threshold. The voltage of signals on the first lead is not greater than the sixth threshold. It is noted that, in at least one embodiment, the first short-circuit ring can also be connected to a second lead, or connected to both the first lead and the second lead, which is not limited herein.

In one example, the fifth threshold is related to the structure of the third electrostatic discharging device. When the third electrostatic discharging device adopts two thin film transistors, the fifth threshold is about hundreds of volts or even thousands of volts.

In one example, the sixth threshold is determined by characteristics of thin film transistors in the third electrostatic discharging device and is about zero volt.

When the third electrostatic discharging device uses two thin film transistors, if the voltage of signals on the first short-circuit ring connected with the third electrostatic discharging device is not greater than the fifth threshold, the third electrostatic discharging device is turned on with a large on-current. Thus, static charges on the first short-circuit ring connected with it will be released rapidly, resulting in a voltage on the first short-circuit ring equal to that on the first lead, that is, not greater than the sixth threshold, and the third electrostatic discharging device is turned off.

Figure 4A:
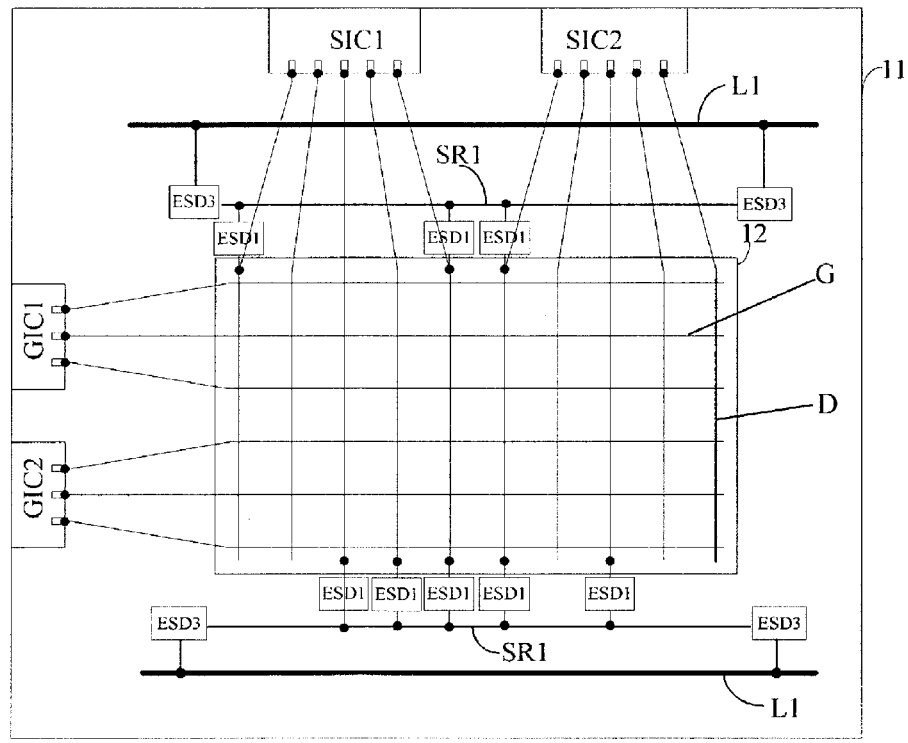
FIG. 4a is a structural schematic view of an array substrate IV provided in an embodiment of the present invention.

The array substrate 11 shown in FIG. 4a includes a plurality of data lines D (longitudinal leads in the display area 12), a plurality of gate lines G (transversal leads in the display area 12) and two first short-circuit rings SR1 on the array substrate 11. In the case shown in FIG. 4a, six data lines are connected with the first short-circuit ring SR1 on the array substrate 11 through respective first electrostatic discharging devices ESD1 with each first electrostatic discharging device ESD 1 connected with only one data line. Four data lines are respectively connected with one first electrostatic discharging device ESD1, and two data lines are respectively connected with two first electrostatic discharging devices ESD1 disposed on two ends thereof respectively. Each first short-circuit ring SR1 is connected with the first lead L1 through two third electrostatic discharging devices ESD3. In different examples, the first short-circuit rings SR1 may be in the display area 12, and may also be outside the display area 12, for example, the first short-circuit ring SR1 is located outside the display area 12. The first lead L1 may be located in the display area 12, and may also be located outside the display area 12, for example, the first lead L1 may be located outside the display area 12. In one example, FIG. 4 a further includes source driving integrated circuits SIC1 and SIC2 connected with data lines and gate driving integrated circuits GIC1 and GIC2 connected with gate lines. The source driving integrated circuits SIC1 and SIC2 and the gate driving integrated circuits GIC1 and GIC2 may be located on the array substrate 1, or may be located on a flexible circuit board connected with the array substrate. One or more first leads L1 may be disposed on the array substrate 11. One or more first short-circuit rings SR1 may be disposed on the array substrate. It is to be noted that in at least one embodiment, the first short-circuit rings SR1 may also be connected with gate lines through electrostatic discharging devices.

When the voltage of a signal on the first short-circuit ring is greater than a fifth threshold, the third electrostatic discharging device connected with the first short-circuit ring is turned on, allowing static charges on the first short-circuit ring to be released onto the first lead L1 through the third electrostatic discharging device connected with the first short-circuit ring. While after static charges are released, when the voltage of a signal on the first short-circuit ring is not greater than the sixth threshold, the third electrostatic discharging device connected with the first short-circuit ring is turned off, preventing the signal on the data line connected with the first electrostatic discharging device connected with the first short-circuit ring from being interfered by the signal on the first lead L1. These data lines can transmit signals output by the source driving integrated circuits to pixels without any interference (not shown in FIG. 4a). With the structure of two stages of electrostatic discharging devices connected in series, it is possible to avoid interference on the signal on data lines by the signal on the first lead L1. Of course, it is also possible to use a structure with more stages of electrostatic discharging devices connected in series, which is not described any more herein.

K first short-circuit rings and M first electrostatic discharging devices may be provided in the array substrate provided in at least one embodiment of the present invention. Mod(M/K) first short-circuit rings in the K first short-circuit rings are each connected with $$\frac{M - \text{mod}(M/K)}{K} + 1$$

first electrostatic discharging devices. Other first short-circuit rings in the K first short-circuit rings are each connected with $$\frac{M - \text{mod}(M/K)}{K}$$

first electrostatic discharging devices. Mod represents a mode function, and K is less than or equal to M.

For example, 3 first short-circuit rings and 7 first electrostatic discharging devices are provided on the array substrate. One of the 3 first short-circuit rings is connected with 3 first electrostatic discharging devices. The other two of the 3 first short-circuit rings are each connected with 2 first electrostatic discharging devices.

One first short-circuit ring connects the first electrostatic discharging devices with a third electrostatic discharging device, that is, the first electrostatic discharging device and the third electrostatic discharging device should be passed to release static charges accumulated on one data line and the source driving integrated circuit connected with it. This can improve the reliability of the circuit and avoid signal crosstalk in case of shorting of the first electrostatic discharging device or the third electrostatic discharging device. In addition, K first short-circuit rings means K electrostatic discharge paths, which can mitigate the stress of electrostatic discharge and improve the efficiency of electrostatic discharge.

The array substrate provided in at least one embodiment of the present invention may further include at least one second short-circuit ring located for example on the array substrate, each connected with at least one second electrostatic discharging device and connected with a second lead on the array substrate through a fourth electrostatic discharging device. The fourth electrostatic discharging device is configured to be turned on when a voltage of a signal on the second short-circuit ring connected with it is greater than a seventh threshold, and turned off when a voltage of a signal on the second short-circuit ring connected with it is not greater than a eighth threshold. The voltage of signals on the second lead is not greater than the eighth threshold. It is noted that, in at least one embodiment, the first short-circuit ring can also be connected to a second lead, or connected to both the first lead and the second lead, which is not limited herein.

In one example, the seventh threshold is related to the structure of the fourth electrostatic discharging device. When the fourth electrostatic discharging device adopts two thin film transistors, the seventh threshold is about hundreds of volts or even thousands of volts.

In one example, the eighth threshold is determined by characteristics of thin film transistors in the fourth electrostatic discharging device and is about zero volt.

When the fourth electrostatic discharging device uses two thin film transistors, if the voltage of signals on the second short-circuit ring connected with the fourth electrostatic discharging device is greater than the seventh threshold, the fourth electrostatic discharging device is turned on with a large on-current. Thus, static charges on the second short-circuit ring connected with it will be released rapidly, resulting in a voltage on the second short-circuit ring equal to that on the second lead, that is, not greater than the eighth threshold, and the fourth electrostatic discharging device is turned off.

Figure 4B:
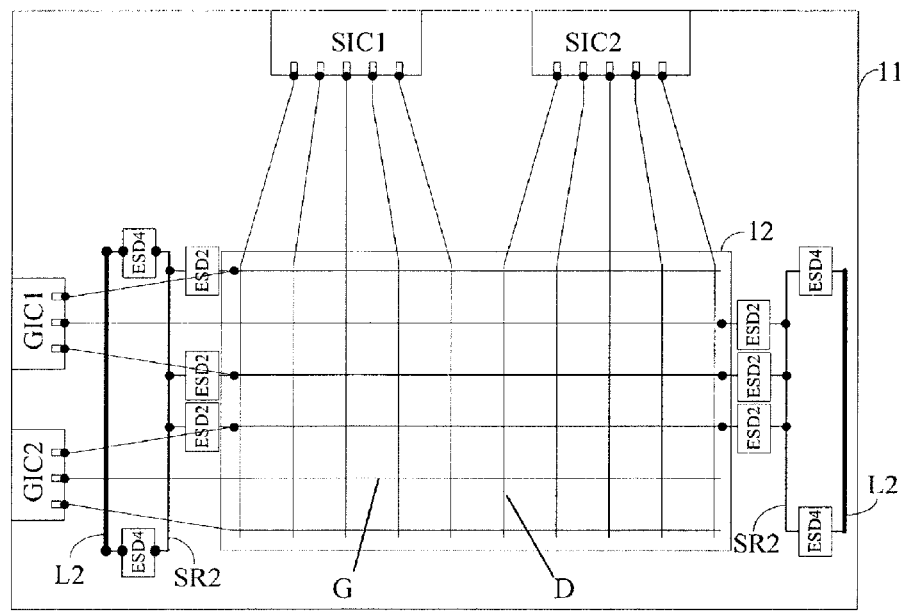
FIG. 4b is a structural schematic view of an array substrate V provided in an embodiment of the present invention.

The array substrate 11 shown in FIG. 4b includes a plurality of data lines D (longitudinal leads in the display area 12), a plurality of gate lines G (transversal leads in the display area 12), and two second short-circuit rings SR2 on the array substrate 11 in which one second short-circuit ring connects the second electrostatic discharging devices and the fourth electrostatic discharging devices in series. In the case shown in FIG. 4b, four gate lines are connected with the second short-circuit rings SR2 on the array substrate 11 through the second electrostatic discharging devices ESD2 with each second electrostatic discharging device ESD2 connected with only one gate line. In one example, there are two gate lines connected with one second electrostatic discharging device ESD2 respectively and two gate lines connected with two second electrostatic discharging devices ESD2 respectively. Each second short-circuit ring SR2 is connected with the second lead L2 through two fourth electrostatic discharging devices ESD4. In different examples, the second short-circuit rings SR2 may be in the display area 12, and may also be outside the display area 12, for example, the second short-circuit ring SR2 is located outside the display area 12. The first lead L2 may be located in the display area 12, and may also be located outside the display area 12, for example, the second lead L2 may be located outside the display area 12. In one example, FIG. 4b further includes source driving integrated circuits SIC1 and SIC2 connected with data lines and gate driving integrated circuits GIC1 and GIC2 connected with gate lines. The source driving integrated circuits SIC1 and SIC2 and the gate driving integrated circuits GIC1 and GIC2 may be located on the array substrate 1, and may also be located on a flexible circuit board connected with the array substrate. One or more second leads L2 may be disposed on the array substrate 11. One or more second short-circuit rings SR2 may be disposed on the array substrate. It is to be noted that in at least one embodiment, the second short-circuit rings SR2 may also be connected with data lines through electrostatic discharging devices.

When the voltage of a signal on the second short-circuit ring is greater than a seventh threshold, the fourth electrostatic discharging device connected with the second short-circuit ring is turned on, allowing static charges on the second short-circuit ring to be released onto the second lead L2 through the fourth electrostatic discharging device connected with the second short-circuit ring. While after static charges are released, when the voltage of the signal on the second short-circuit ring is not greater than the eighth threshold, the fourth electrostatic discharging device connected with the second short-circuit ring is turned off, preventing the signal on the gate line connected with the second electrostatic discharging device connected with the second short-circuit ring from being interfered by the signal on the second lead L2. The gate line can transmit signals output by the gate driving integrated circuit to pixels without any interference (not shown in FIG. 4b). With the structure of two stages of electrostatic discharging devices connected in series, it is possible to better avoid interference on the signal on gate lines by the signal on the second lead L2. Of course, it is also possible to use a structure with more stages of electrostatic discharging device connected in series.

L second short-circuit rings and N second electrostatic discharging devices may be provided on the array substrate provided in at least one embodiment of the present invention. Mod(N/L) second short-circuit rings in the L second short-circuit rings are each connected with $$\frac{N - \mathrm{mod}(N/L)}{L} + 1$$

second electrostatic discharging devices. Other second short-circuit rings in the L second short-circuit rings are each connected with $$\frac{N - \mathrm{mod}(N/L)}{L}$$

second electrostatic discharging devices. Mod represents a mode function, and L is less than or equal to N.

For example, there are 4 second short-circuit rings and there are 7 second electrostatic discharging devices. Then 3 of the 4 second short-circuit rings are each connected with 2 second electrostatic discharging devices, and another one of the 4 second short-circuit rings is connected with L second electrostatic discharging device.

One second short-circuit ring connects the second electrostatic discharging devices with a fourth electrostatic discharging device in series, that is, the second electrostatic discharging devices and the fourth electrostatic discharging device should be passed to release static charges accumulated on one gate line and the gate driving integrated circuit connected with it, which can improve the reliability of the circuit and avoid signal crosstalk in case of shorting of the second electrostatic discharging devices or the fourth electrostatic discharging device. In addition, L second short-circuit rings means L electrostatic discharge paths, which can mitigate the stress of electrostatic discharge and improve the efficiency of electrostatic discharge.

It is to be noted that the first lead L1 and the second lead L2 in the accompanying drawings are only for illustrative explanation, but embodiments of the present invention are not limited thereto. For example, the first lead and the second lead may exchange their positions, or may be the same lead. In different examples, the first lead on the array substrate and/or the second lead on the array substrate may be a common electrode line. Of course, there are other settings, which are not limited herein.

Figure 5:
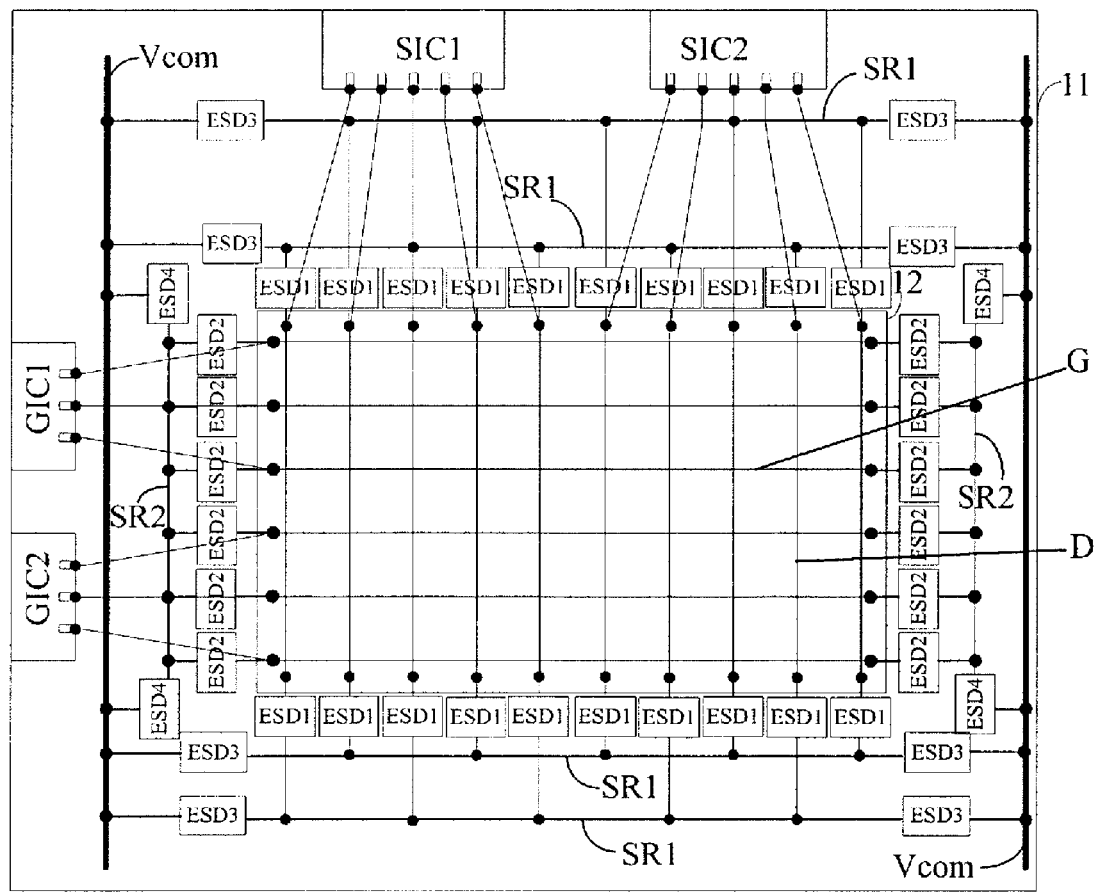
FIG. 5 is a structural schematic view of an array substrate VI provided in an embodiment of the present invention.

For example, FIG. 5 shows a case in which the first lead and the second lead are the same lead and are the common electrode line, that is, the first lead and the second lead are both the common electrode line The array substrate 11 includes a plurality of data lines D (longitudinal leads in the display area 12), a plurality of gate lines G (transversal leads in the display area 12), a common electrode line Vcom on the array substrate 11, four first short-circuit rings SR1 and two second short-circuit rings SR2. Each data line is connected with the first short-circuit ring SR1 on the array substrate 11 through two first electrostatic discharging devices ESD1. Each first electrostatic discharging device ESD1 is connected with only one data line, adjacent two data lines are connected to different first short-circuit rings SR1 through first electrostatic discharging device ESD1 respectively. Each gate line is connected with the second short-circuit rings SR2 on the array substrate 11 through two second electrostatic discharging devices ESD2 with each second electrostatic discharging device ESD2 connected with only one gate line. Each first short-circuit ring SR1 is connected with the common electrode line Vcom (namely the first lead and the second lead) through two third electrostatic discharging devices ESD3, and each second short-circuit ring SR2 is connected with the common electrode line Vcom (namely the first lead and the second lead) through two fourth electrostatic discharging devices ESD4. In the case shown in FIG. 5, four first short-circuit rings SR1 and two second short-circuit rings SR2 are both located outside the display area 12. FIG. 5 further includes source driving integrated circuits SIC1 and SIC2 connected with data lines and gate driving integrated circuits GIC1 and GIC2 connected with gate lines.

It is noted that the array substrate of the above-mentioned embodiments may be applied to organic light emitting diode panels, thin film transistor liquid crystal display panels, which are not limited herein. Furthermore, the first and second leads, and the first and second short-circuit rings may also have other arrangements as long as they can function to provide electrostatic discharge paths.

An embodiment of the present invention further provides a display panel including the above-mentioned array substrate.

An embodiment of the present invention further provides a display device including the above-mentioned array substrate. The display device may be any products or components with display function such as electronic paper, cell phones, flat computers, TV sets, displays, notebook computers, digital picture frames, and navigators.

Obviously, one skilled in the art can make various changes and variations to the present invention without departing from the spirit and scope of the present invention. Thus, if these changes and variations of the present invention fall within the scope of claims and equivalents of the present invention, it is intended that the present invention also include these changes and variations.

The present application claims priority of a China patent application no. 201310745801.6 filed on Dec. 30, 2013, which is incorporated in its entirety herein by reference as part of the present application.

The invention claimed is:

1. An array substrate comprising a plurality of data lines, a plurality of gate lines, a first lead and/or a second lead, wherein where the array substrate comprises the first lead, at least one data line is connected with the first lead through at least one first electrostatic discharging device, each first electrostatic discharging device is connected with only one data line, the first electrostatic discharging device is configured to be turned on when a voltage of a signal on the data line connected with it is greater than a first threshold, and turned off when the voltage of the signal on the data line connected with it is not greater than a second threshold, and a voltage of a signal on the first lead is not greater than the second threshold;

where the array substrate comprises the second lead, at least one gate line is connected with the second lead through at least one second electrostatic discharging device, each of the second electrostatic discharging device is connected with only one gate line, the second electrostatic discharging device is configured to be turned on when a voltage of a signal on the gate line connected with it is greater than a third threshold, and turned off when the voltage of the signal on the gate line connected with it is not greater than a fourth threshold, and a voltage of a signal on the second lead is not greater than the fourth threshold;

wherein the array substrate further comprises a third electrostatic discharging device and at least one first short-circuit ring, each first short-circuit ring is connected with at least one first electrostatic discharging device, and each first short-circuit ring is connected with the first lead and/or the second lead through at least one third electrostatic discharging device, and the third electrostatic discharging device is configured to be turned on when a voltage of a signal on the first short-circuit ring connected with it is greater than a fifth threshold, and turned off when the voltage of the signal on the first short-circuit ring connected with It is not greater than a sixth threshold, and the voltage of the signal on the first lead and/or the second lead is not greater than the sixth threshold;

wherein there are K first short-circuit rings and M first electrostatic discharging devices, mod(M/K) first short-circuit rings in the K first short-circuit rings are each connected with $$\frac{M - \mathrm{mod}(M/K)}{K} + 1$$

first electrostatic discharging devices, other first short-circuit rings are each connected with $$\frac{M - \mathrm{mod}(M/K)}{K}$$

first electrostatic discharging devices, the mod represents a mode function, M is an integer larger than zero, and K is an integer larger than zero and less than or equal to M.

2. The array substrate of claim 1, wherein each data line is connected with the first lead through at least one first electrostatic discharging device.

3. The array substrate of claim 2, wherein each gate line is connected with the second lead through at least one second electrostatic discharging device.

4. The array substrate of claim 1, wherein each gate line is connected with the second lead through at least one second electrostatic discharging device.

5. The array substrate of claim 1, further comprising a fourth electrostatic discharging device and at least one second short-circuit ring, wherein each second short-circuit ring is connected with at least one second electrostatic discharging device, and each second short-circuit ring is connected with the first lead and/or the second lead through at least one fourth electrostatic discharging device; and the fourth electrostatic discharging device is configured to be turned on when a voltage of a signal on the second short-circuit ring connected with it is greater than a seventh threshold, and turned off when the voltage of the signal on the second short-circuit ring connected with it is not greater than an eighth threshold, and the voltage of the signal on the first lead and/or the second lead is not greater than the eighth threshold.

6. The array substrate of claim 5, wherein there are L second short-circuit rings and N second electrostatic discharging devices, mod(N/L) second short-circuit rings in the L first short-circuit rings are each connected with $$\frac{N - \mathrm{mod}(N/L)}{L} + 1$$

second electrostatic discharging devices, other second short-circuit rings are each connected with $$\frac{N - \mathrm{mod}(N/L)}{L}$$

second electrostatic discharging devices, the mod represents a mode function, N is an integer larger than zero, and L is an integer larger than zero and less than or equal to N.

7. The array substrate of claim 5, wherein a combination of any one or more of the first lead, the second lead, the first short-circuit ring and the second short-circuit ring is located in a display area; and/or
   a combination of any one or more of the first lead, the second lead, the first short-circuit ring and the second short-circuit ring is located outside the display area.

8. The array substrate of claim 1, wherein the first lead and/or the second lead are a common electrode line.

9. The array substrate of claim 8, comprising a common electrode line, four first short-circuit rings and two second short-circuit rings, wherein
   each data line is connected with the first short-circuit rings through two first electrostatic discharging devices;
   each first electrostatic discharging device is connected with only one data line;
   adjacent two data lines are connected to different first short-circuit rings through first electrostatic discharging devices respectively;
   each gate line is connected with the second short-circuit rings through two second electrostatic discharging devices;
   each second electrostatic discharging device is connected with only one gate line;
   each first short-circuit ring is connected with the common electrode line through two third electrostatic discharging devices; and
   each second short-circuit ring is connected with the common electrode line through two fourth electrostatic discharging devices.

10. The array substrate of claim 1, wherein one or more of the first leads are provided; and/or one or more of the second leads are provided.

11. The array substrate of claim 1, further comprising a source driving integrated circuit connected with the data lines and a gate driving integrated circuit connected with the gate line, wherein
   the source driving integrated circuit is located on the array substrate or on a flexible circuit board connected with the array substrate; and/or
   the gate driving integrated circuit is located on the array substrate or on a flexible circuit board connected with the array substrate.

12. A display panel comprising the array substrate of claim 1.

13. A display device comprising the display panel of claim 12.

14. An array substrate comprising a plurality of data lines, a plurality of cote lines, a first lead and/or a second lead, wherein where the array substrates comprises the first lead, at least one data line is connected with the first lead through at least one first electrostatic discharging device, each first electrostatic discharging device is connected with only one data line, the first electrostatic discharging device is configured to be turned on when a voltage of a signal on the data line connected with it is greater than a first threshold, and turned off when the voltage of the signal on the data line connected with it is not greater than a second threshold, and a voltage of a signal on the first lead is not greater than the second threshold;

where the array substrate comprises the second lead, at least one gate line is connected with the second lead through at least one second electrostatic discharging device, each of the second electrostatic discharging device is connected with only one gate line, the second electrostatic discharging device is configured to be turned on when a voltage of a signal on the gate line connected with it is greater than a third threshold, and turned off when the voltage of the signal on the gate line connected with it is not greater than a fourth threshold, and a voltage of a signal on the second lead is not greater than the fourth threshold;

wherein the array substrate further comprises a fourth electrostatic discharging device and at least one second short-circuit ring, wherein each second short-circuit ring is connected with at least one second electrostatic discharging device, and each second short-circuit ring is connected with the first lead and/or the second lead through at least one fourth electrostatic discharging device; and the fourth electrostatic discharging device is configured to be turned on when a voltage of a signal on the second short-circuit ring connected with it is greater than a seventh threshold, and turned off when the voltage of the signal on the second short-circuit ring connected with it is not greater than an eighth threshold, and the voltage of the signal on the first lead and/or the second lead is not greater than the eighth threshold;

wherein there are L second short-circuit rings and N second electrostatic discharging devices, mod(N/L) second short-circuit rings in the L first short-circuit rings are each connected with $$\frac{N - \mathrm{mod}(N/L)}{L} + 1$$

second electrostatic discharging devices, other second short-circuit rings are each connected with $$\frac{N - \mathrm{mod}(N/L)}{L}$$

second electrostatic discharging devices, the mod represents a mode function, and N is an integer larger than zero, L is an integer larger than zero and less than or equal to N.

* * * * *